US012696635B2

(12) United States Patent
Cho et al.

(10) Patent No.: US 12,696,635 B2
(45) Date of Patent: Jul. 28, 2026

(54) DISPLAY DEVICE

(71) Applicant: Samsung Display Co., LTD., Yongin-si (KR)

(72) Inventors: Seung-Hwan Cho, Yongin-si (KR); Jong-Hyun Choi, Seoul (KR); Seung-Lyong Bok, Hwaseong-si (KR); Jung-Kyu Lee, Seo-gu (KR); Young-Cheol Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 727 days.

(21) Appl. No.: 17/595,762

(22) PCT Filed: Nov. 18, 2019

(86) PCT No.: PCT/KR2019/015779
§ 371 (c)(1),
(2) Date: Nov. 23, 2021

(87) PCT Pub. No.: WO2020/246669
PCT Pub. Date: Dec. 10, 2020

(65) Prior Publication Data
US 2022/0231258 A1 Jul. 21, 2022

(30) Foreign Application Priority Data

Jun. 5, 2019 (KR) ........................ 10-2019-0066932

(51) Int. Cl.
*H01L 51/52* (2006.01)
*H10K 59/131* (2023.01)
(Continued)

(52) U.S. Cl.
CPC ....... *H10K 59/131* (2023.02); *H10K 59/8731* (2023.02); *H10K 59/871* (2023.02); *H10K 2102/311* (2023.02)

(58) Field of Classification Search
CPC .. H10K 50/844; H10K 50/865; H10K 59/131; H10K 2102/311; H10K 59/8731;
(Continued)

(56) References Cited

U.S. PATENT DOCUMENTS 8,723,824 B2    5/2014   Myers et al.
8,976,141 B2    3/2015   Myers et al.
(Continued)

FOREIGN PATENT DOCUMENTS

CN          109560109 A      4/2019
KR    10-2014-0085956        7/2014
(Continued)

OTHER PUBLICATIONS

International Search Report of PCT/KR2019/015779, Mar. 6, 2020, 4 pages.
(Continued)

*Primary Examiner* — Ermias T Woldegeorgis
(74) *Attorney, Agent, or Firm* — Womble Bond Dickinson (US) LLP

(57) ABSTRACT

A display device includes a first display area, a second display area and a non-display area between the first display area and the second display area and extending in a first direction, at least a portion of the non-display area having a bending area connecting the first display area to the second display area, the display device comprising: light-emitting elements on a base substrate in the first display area and in the second display area; a first encapsulation layer covering light-emitting elements in the first display area; a second encapsulation layer covering light-emitting elements in the second display area; a signal wiring crossing the non-display area and extending in a second direction; and an upper (Continued)

compensation layer in the non-display area and filling a gap between the first encapsulation layer and the second encapsulation layer.

16 Claims, 14 Drawing Sheets

(51) Int. Cl.
　H10K 59/80 　　(2023.01)
　H10K 102/00 　　(2023.01)
(58) Field of Classification Search
　CPC .... H10K 59/124; H10K 59/126; H10K 59/40;
　　　　　　 H10K 59/871; H10K 2102/301
　See application file for complete search history.

(56) References Cited

U.S. PATENT DOCUMENTS

| | | | |
|---|---|---|---|
| 9,780,157 B2 | 10/2017 | Kwon et al. | |
| 9,966,564 B2 | 5/2018 | Kang et al. | |
| 10,325,972 B2 | 6/2019 | Park et al. | |
| 10,569,501 B2 | 2/2020 | Lim et al. | |
| 11,075,347 B2 | 7/2021 | Bae et al. | |
| 11,175,697 B2 | 11/2021 | Jeong et al. | |
| 2013/0161631 A1* | 6/2013 | Lee | H10K 59/1201 |
| | | | 438/23 |
| 2014/0049449 A1* | 2/2014 | Park | H10K 59/128 |
| | | | 29/841 |
| 2014/0098471 A1* | 4/2014 | Nam | G06F 1/165 |
| | | | 361/679.01 |
| 2014/0183473 A1* | 7/2014 | Lee | H10K 59/8722 |
| | | | 257/40 |
| 2014/0339508 A1* | 11/2014 | Hong | H10K 59/123 |
| | | | 257/40 |
| 2015/0162392 A1* | 6/2015 | Lim | H10K 59/1213 |
| | | | 257/72 |
| 2017/0192278 A1 | 7/2017 | Jia | |
| 2017/0237025 A1* | 8/2017 | Choi | H10K 50/844 |
| | | | 257/40 |
| 2018/0313753 A1 | 11/2018 | Marshall et al. | |
| 2018/0343753 A1* | 11/2018 | Kim | H10K 59/131 |

FOREIGN PATENT DOCUMENTS

| | | |
|---|---|---|
| KR | 10-2015-0065554 | 6/2015 |
| KR | 10-2015-0115618 | 10/2015 |
| KR | 10-2017-0032955 A | 3/2017 |
| KR | 10-2017-0036866 | 4/2017 |
| KR | 10-2017-0095809 A | 8/2017 |
| KR | 10-2017-0096089 | 8/2017 |
| KR | 10-2018-0029086 A | 3/2018 |
| KR | 10-2018-0068382 A | 6/2018 |
| KR | 10-2018-0129007 | 12/2018 |
| KR | 10-2019-0037380 A | 4/2019 |
| KR | 10-2020-0045382 A | 5/2020 |

OTHER PUBLICATIONS

Korean Office Action for KR Application No. 10-2019-0066932 dated Apr. 29, 2024, 10 pages.

* cited by examiner

DISPLAY DEVICE

CROSS-REFERENCE TO RELATED APPLICATIONS

The present application is a U.S. National Phase Patent Application of International Patent Application Number PCT/KR2019/015779, filed on Nov. 18, 2019, which claims priority to Korean Patent Application Number 10-2019-0066932, filed on Jun. 5, 2019, the entire content of all of which is incorporated herein by reference.

FIELD

Aspects of some embodiments of the present invention relate to a display device. For example, aspects of some embodiments of the present invention relate to a display device including a display area at a side surface thereof.

BACKGROUND

Generally, a display device has a display area on a substrate. Recently, a display device having a display area expanded to a side surface by bending a substrate is being developed.

However, a stress applied to a bending area may cause damage to a display device and decrease of durability.

The above information disclosed in this Background section is only for enhancement of understanding of the background and therefore the information discussed in this Background section does not necessarily constitute prior art.

SUMMARY

Aspects of some embodiments include a display device having a relatively expanded display area and relatively improved reliability.

The invention may, however, be embodied in many different forms and should not be construed as limited to the embodiments set forth herein.

According to some embodiments, a display device includes a first display area, a second display area and a non-display area disposed between the first display area and the second display area and extending in a first direction. The first display area extends in a horizontal direction, and the second display area extends in a vertical direction. At least a portion of the non-display area forms a bending area, which connects the first display area and the second display area to each other and bends to have a curvature. The display device includes light-emitting elements disposed on a base substrate in the first display area and in the second display area, a first encapsulation layer covering light-emitting elements disposed in the first display area, a second encapsulation layer covering light-emitting elements disposed in the second display area, a signal wiring crossing the non-display area and extending in a second direction, and an upper compensation layer disposed in the non-display area and filling a gap between the first encapsulation layer and the second encapsulation layer.

According to some embodiments, the display device further includes an organic protective pattern disposed under the upper compensation layer.

According to some embodiments, the non-display area includes a first non-display area where the organic protective pattern is disposed, and a second non-display area where the first and second encapsulation layers, which extend from the first and second display areas, directly contact an inorganic insulation layer disposed thereunder.

According to some embodiments, the signal wiring includes a first signal wiring pattern disposed under the inorganic insulation layer, a second signal wiring pattern spaced apart from the first signal wiring pattern in the second direction, and a bridge pattern disposed in the first non-display area and electrically contacting the first signal wiring pattern and the second signal wiring pattern.

According to some embodiments, the organic protective pattern includes a first organic pattern and a second organic pattern disposed on the first organic pattern. The bridge pattern is disposed between the first organic pattern and the second organic pattern.

According to some embodiments, the display device further includes a power bus wiring disposed in the non-display area and extending in the first direction. The bridge pattern is disposed on the power bus wiring.

According to some embodiments, the display device further includes a power bus wiring disposed in the non-display area and extending in the first direction. The bridge pattern is disposed under the power bus wiring.

According to some embodiments, the bridge pattern is disposed under the organic protective pattern.

According to some embodiments, the display device further includes a power bus wiring disposed in the non-display area and extending in the first direction.

According to some embodiments, the power bus wiring is disposed under the organic protective pattern.

According to some embodiments, the display device further includes a lower compensation layer disposed between the base substrate and the organic protective pattern and including an organic material.

According to some embodiments, the signal wiring extends over the lower compensation layer.

According to some embodiments, the display device further includes a touch-sensing line extending along the first direction in the non-display area and disposed on the upper compensation layer, and a shielding pattern disposed between the upper compensation layer and the signal wiring.

According to some embodiments, the shielding pattern is disposed in a same layer as a lower electrode of the light-emitting element.

According to some embodiments, the display device further includes a power bus wiring disposed under the shielding pattern and extending in the first direction.

According to some embodiments, the display device further includes a supporting film combined with a lower surface of the base substrate and having an opening overlapping the non-display area.

According to some embodiments, the display device further includes a supporting film combined with a lower surface of the base substrate. The supporting film includes a supporting portion overlapping the first and second display areas and a bending portion overlapping the non-display area and including a material different from the supporting portion.

According to some embodiments, the display device further includes a power wiring crossing the non-display area and extending in the second direction.

According to some embodiments, the power wiring includes a first power wiring pattern extending in the second direction, a second power wiring pattern spaced apart from the first power wiring pattern, and a bridge pattern disposed in the non-display area and electrically contacting the first power wiring pattern and the second power wiring pattern.

According to some embodiments, the display device further includes a driving circuit disposed in the non-display area.

According to some embodiments of the invention, a bending area of a display device does not include a light-emitting element and an encapsulation layer. Thus, a curvature of the display device, especially, a curvature of an inorganic layer, which is weak at stress, may be reduced. Thus, reliability of a display device having a bending area may be improved.

Furthermore, a power bus wiring, a touch wiring or a driving circuit may be formed in the non-display area. Thus, a peripheral area where the power bus wiring, the touch wiring or the driving circuit is disposed in a display device may be reduced. Thus, a bezel of a display device may be reduced.

BRIEF DESCRIPTION OF THE DRAWINGS

FIG. 1 is a plan view illustrating a display device according to some embodiments of the invention.

DETAILED DESCRIPTION

Figure 2:
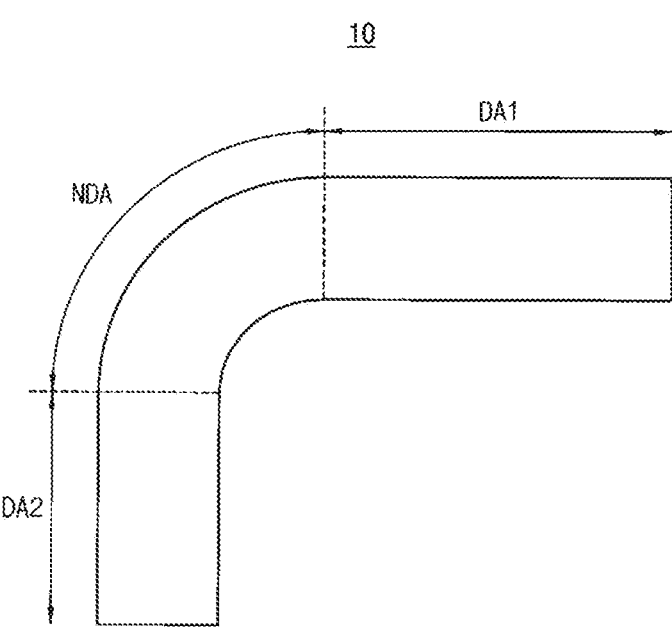
FIG. 2 is a lateral view illustrating a display device according to some embodiments of the invention.

A display device according to some embodiments will be described more fully hereinafter with reference to the accompanying drawings, in which aspects of some embodiments are shown. In the accompanying drawings, same or similar reference numerals may be used for same or similar elements.

Figure 1:
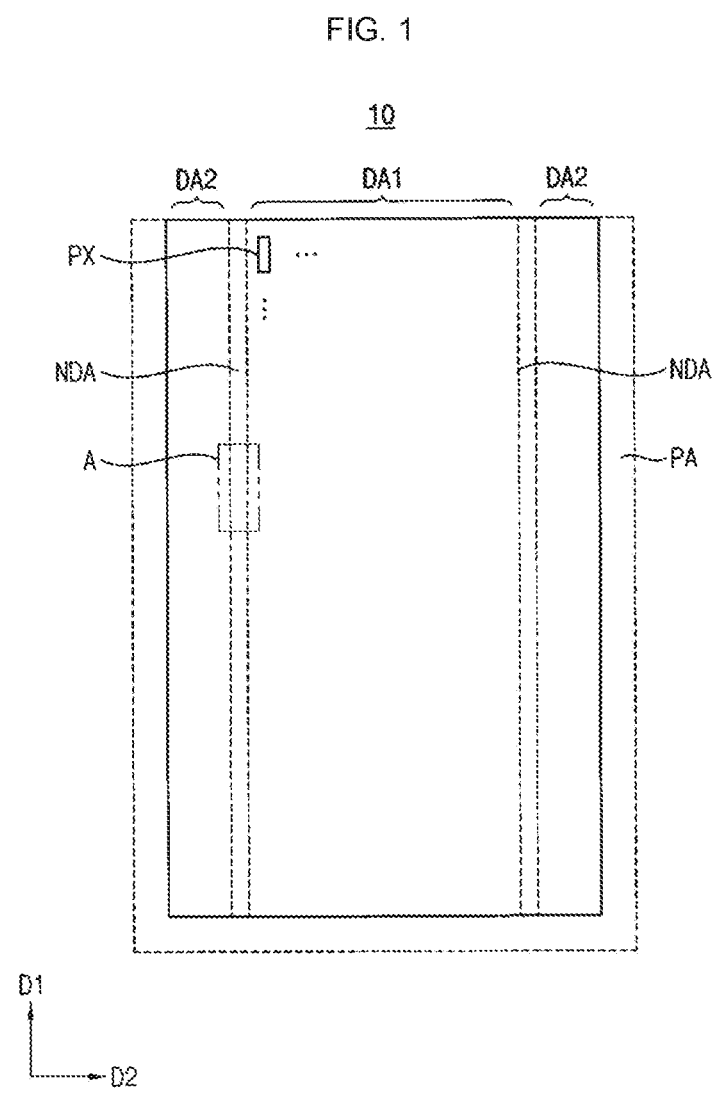

FIG. 1 is a plan view illustrating a display device according to some embodiments of the invention. FIG. 2 is a lateral view illustrating a display device according to some embodiments of the invention.

Referring to FIGS. 1 and 2, a display device 10 according to some embodiments includes a first display area DA1 and a second display area DA2. According to some embodiments, the display device 10 may partially bend to have a lateral display area. For example, the first display area DA1 may correspond to a front display area, and the second display area DA2 may correspond to a lateral display area. FIG. 1 illustrates the display device 10 having a flat shape without a bending area for ease of explanation.

An array of pixels PX including a light-emitting element are arranged in each of the display areas DA1 and DA2 to generate a light in response to a driving signal.

According to some embodiments, the first display area DA1 may extend in a direction parallel with a horizontal direction, and the second display area DA2 may extend in a direction parallel with a vertical direction, in a cross-sectional view.

According to some embodiments, the display device 10 includes a non-display area NDA arranged between the first display area DA1 and the second display area DA2. According to some embodiments, at least a portion of the non-display area NDA may bend to have a curvature. Thus, the non-display area NDA may correspond to a bending area connecting the front display area and the lateral display area. Thus, the non-display area NDA may have a shape extending in a first direction D1 along a boundary between the first display area DA1 and the second display area DA2.

The non-display area NDA does not include a light-emitting element and an encapsulation layer. Furthermore, an inorganic insulation layer may be removed in the non-display area NDA. Thus, a curvature of the display device, especially, a curvature of an inorganic layer, which is weak at stress, may be reduced. Thus, reliability of a display device having a bending area may be improved.

Furthermore, a signal wiring, a power wiring or a driving circuit may be formed in the non-display area NDA. Thus, a peripheral area PA where the signal wiring, the power wiring or the driving circuit is arranged in a display device may be reduced. Thus, a bezel of a display device may be reduced.

A detailed configuration of the non-display area NDA will be explained in the following.

Figure 3:
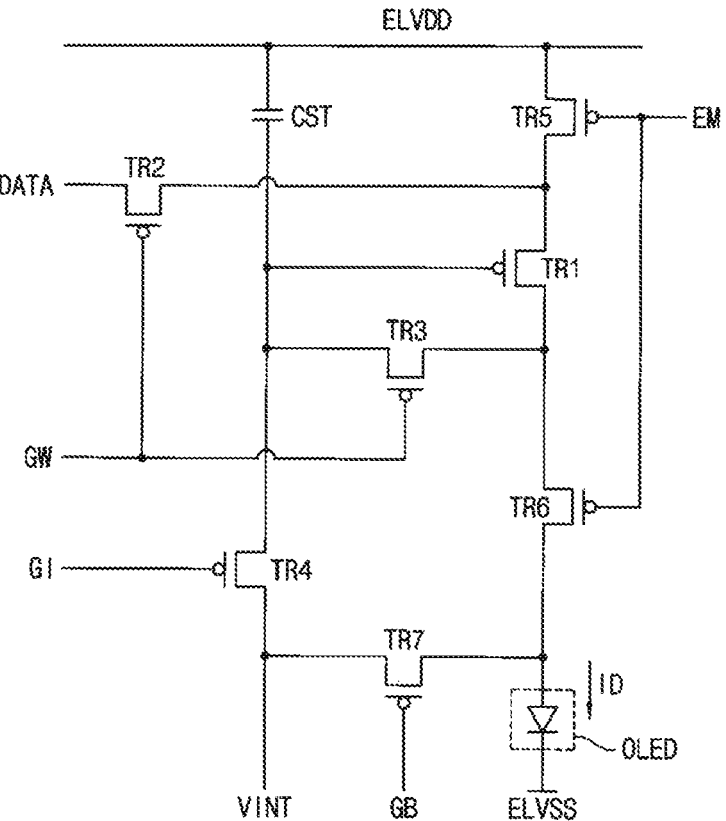
FIG. 3 is a circuit diagram illustrating a pixel unit of a display device according to some embodiments of the invention.

FIG. 3 is a circuit diagram illustrating a pixel unit of a display device according to some embodiments of the invention.

According to some embodiments, a pixel unit of a display device may include a pixel circuit and a light-emitting element. For example, the pixel circuit may include an organic light-emitting diode OLED, first to seventh transistors TR1, TR2, TR3, TR4, TR5, TR6, and TR7, a storage capacitor CST, a wiring for a high power supply voltage ELVDD, a wiring for a low power supply voltage ELVSS, a wiring for an initialization voltage VINT, a wiring for a data signal DATA, a wiring for a gate signal GW, a wiring for a gate initialization signal GI, a wiring for a light emission control signal EM, a wiring for a diode initialization signal GB, etc.

The organic light emitting diode OLED may output a light based on a driving current ID. The organic light emitting diode OLED may include a first terminal and a second terminal. According to some embodiments, the second terminal of the organic light emitting diode OLED may receive a low power supply voltage ELVSS. For example, the first terminal of the organic light emitting diode OLED may be an anode terminal, and the second terminal of the organic light emitting diode OLED may be a cathode terminal. Alternatively, the first terminal of the organic light emitting diode OLED may be a cathode terminal, and the second terminal of the organic light emitting diode OLED may be an anode terminal.

The first transistor TR1 may include a gate terminal, a first terminal, and a second terminal. According to some embodiments, the first terminal of the first transistor TR1 may be a source terminal, and the second terminal of the first transistor TR1 may be a drain terminal. Alternatively, the first terminal of the first transistor TR1 may be a drain terminal, and the second terminal of the first transistor TR1 may be a source terminal.

The first transistor TR1 may generate the driving current ID. According to some embodiments, the first transistor TR1 may operate in a saturation region. In this case, the first transistor TR1 may generate the driving current ID based on a voltage difference between the gate terminal and the source terminal. In addition, a gradation may be expressed based on a magnitude of the driving current ID provided to the organic light emitting diode OLED. Alternatively, the first transistor TR1 may operate in a linear region. In this case, the gradation may be expressed based on the sum of times during which the driving current is provided to the organic light emitting diode OLED within one frame.

The second transistor TR2 may include a gate terminal, a first terminal, and a second terminal. The gate terminal of the second transistor TR2 may receive the gate signal GW. The first terminal of the second transistor TR2 may receive the data signal DATA. The second terminal of the second transistor TR2 may be connected to the first terminal of the first transistor TR1. For example, the gate signal GW may be provided from a gate driver, and the gate signal GW may be applied to the gate terminal of the second transistor TR2 through a gate signal wiring. According to some embodiments, the first terminal of the second transistor TR2 may be a source terminal, and the second terminal of the second transistor TR2 may be a drain terminal. Alternatively, the first terminal of the second transistor TR2 may be a drain terminal, and the second terminal of the second transistor TR2 may be a source terminal.

The second transistor TR2 may provide the data signal DATA to the first terminal of the first transistor TR1 during an activation period of the gate signal GW. In this case, the second transistor TR2 may operate in a linear region.

The third transistor TR3 may include a gate terminal, a first terminal, and a second terminal. The gate terminal of the third transistor TR3 may receive the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver, and the gate signal GW may be applied to the gate terminal of the third transistor TR3 through a gate signal wiring. According to some embodiments, the first terminal of the third transistor TR3 may be a source terminal, and the second terminal of the third transistor TR3 may be a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 during the activation period of the gate signal GW. In this case, the third transistor TR3 may operate in a linear region. That is, the third transistor TR3 may diode-connect the first transistor TR1 during the activation period of the gate signal GW. Because the first transistor TR1 is diode-connected, a voltage difference between the first terminal of the first transistor TR1 and the gate terminal of the first transistor TR1 may be formed as much as a threshold voltage of the first transistor TR1. As a result, a voltage obtained by adding the voltage difference (i.e., the threshold voltage) to a voltage of the data signal DATA provided to the first terminal of the first transistor TR1 may be provided to the gate terminal of the first transistor TR1 during the activation period of the gate signal GW. That is, the data signal DATA may be compensated by the threshold voltage of the first transistor TR1, and the compensated data signal DATA may be provided to the gate terminal of the first transistor TR1. As the threshold voltage compensation is performed, a problem of a non-uniform driving current caused by a threshold voltage deviation of the first transistor TR1 may be solved.

An input terminal of the wiring for the initialization voltage VINT receiving the initialization voltage VINT may be connected to a first terminal of the fourth transistor TR4 and a first terminal of the seventh transistor TR7, and an output terminal of the wiring for the initialization voltage VINT may be connected to a second terminal of the fourth transistor TR4 and a first terminal of the storage capacitor CST.

The fourth transistor TR4 may include a gate terminal, a first terminal, and a second terminal. The gate terminal of the fourth transistor TR4 may receive the gate initialization signal GI. The first terminal of the fourth transistor TR4 may receive the initialization voltage VINT. The second terminal of the fourth transistor TR4 may be connected to the gate terminal of the first transistor TR1. According to some embodiments, the first terminal of the fourth transistor TR4 may be a source terminal, and the second terminal of the fourth transistor TR4 may be a drain terminal. Alternatively, the first terminal of the fourth transistor TR4 may be a drain terminal, and the second terminal of the fourth transistor TR4 may be a source terminal.

The fourth transistor TR4 may provide the initialization voltage VINT to the gate terminal of the first transistor TR1 during an activation period of the gate initialization signal GI. In this case, the fourth transistor TR4 may operate in a linear region. That is, the fourth transistor TR4 may initialize the gate terminal of the first transistor TR1 to the initialization voltage VINT during the activation period of the gate initialization signal GI. According to some embodiments, the initialization voltage VINT may have a voltage level sufficiently lower than a voltage level of the data signal DATA maintained by the storage capacitor CST in a previous frame, and the initialization voltage VINT may be provided to the gate terminal of the first transistor TR1, which is a PMOS (P-channel Metal Oxide Semiconductor) transistor.

According to some embodiments, the initialization voltage may have a voltage level sufficiently higher than the voltage level of the data signal maintained by the storage capacitor in the previous frame, and the initialization voltage may be provided to the gate terminal of the first transistor TR1, which is a NMOS (N-channel Metal Oxide Semiconductor) transistor.

According to some embodiments, the gate initialization signal GI may be a signal substantially identical to the gate signal GW transmitted before one horizontal time. For example, the gate initialization signal GI provided to a pixel circuit in an n-th row (where n is an integer of 2 or more) among a plurality of pixel circuits included in the display device may be substantially identical to the gate signal GW provided to a pixel circuit in an (n−1)-th row among the pixel circuits. That is, an activated gate initialization signal GI may be provided to a first pixel circuit in the n-th row among the pixel circuits by providing an activated gate signal GW to a first pixel circuit in the (n–1)-th row among the pixel circuits. As a result, the data signal DATA may be provided to the pixel circuit in the (n–1)-th row among the pixel circuits while the gate terminal of the first transistor TR1 included in the pixel circuit in the n-th row among the pixel circuits are initialized to the initialization voltage VINT.

The fifth transistor TR5 may include a gate terminal, a first terminal, and a second terminal. The gate terminal may receive the light emission control signal EM. The first terminal may be connected to the wiring for the high power supply voltage ELVDD. The second terminal may be connected to the first terminal of the first transistor TR1. For example, the light emission control signal EM may be provided from a light emission control driver, and the light emission control signal EM may be applied to the gate terminal of the fifth transistor TR5 through the wiring for the light emission control signal EM. According to some embodiments, the first terminal of the fifth transistor TR5 may be a source terminal, and the second terminal of the fifth transistor TR5 may be a drain terminal. Alternatively, the first terminal of the fifth transistor TR5 may be a drain terminal, and the second terminal of the fifth transistor TR5 may be a source terminal.

The fifth transistor TR5 may provide the high power supply voltage ELVDD to the first terminal of the first transistor TR1 during an activation period of the light emission control signal EM. Alternatively, the fifth transistor TR5 may shut off the supply of the high power supply voltage ELVDD during a deactivation period of the light emission control signal EM. In this case, the fifth transistor TR5 may operate in a linear region. The fifth transistor TR5 provides the high power supply voltage ELVDD to the first terminal of the first transistor TR1 during the activation period of the light emission control signal EM, so that the first transistor TR1 may generate the driving current ID. In addition, the fifth transistor TR5 shuts off the supply of the high power supply voltage ELVDD during the deactivation period of the light emission control signal EM, so that the data signal DATA provided to the first terminal of the first transistor TR1 may be provided to the gate terminal of the first transistor TR1.

The sixth transistor TR6 may include a gate terminal, a first terminal, and a second terminal. The gate terminal may receive the light emission control signal EM. The first terminal may be connected to the second terminal of the first transistor TR1. The second terminal may be connected to the first terminal of the organic light emitting diode OLED. For example, the light emission control signal EM may be provided from the light emission control driver, and the light emission control signal EM may be applied to the gate terminal of the sixth transistor TR6 through the wiring for the light emission control signal EM. According to some embodiments, the first terminal of the sixth transistor TR6 may be a source terminal, and the second terminal of the sixth transistor TR6 may be a drain terminal. Alternatively, the first terminal of the sixth transistor TR6 may be a drain terminal, and the second terminal of the sixth transistor TR6 may be a source terminal.

The sixth transistor TR6 may provide the driving current ID generated by the first transistor TR1 to the organic light emitting diode OLED during the activation period of the light emission control signal EM. In this case, the sixth transistor TR6 may operate in a linear region. That is, the sixth transistor TR6 provides the driving current ID generated by the first transistor TR1 to the organic light emitting diode OLED during the activation period of the light emission control signal EM, so that the organic light emitting diode OLED may output light. In addition, the sixth transistor TR6 electrically separates the first transistor TR1 from the organic light emitting diode OLED during the deactivation period of the light emission control signal EM, so that the data signal DATA provided to the second terminal of the first transistor TR1 (more precisely, a data signal compensated by threshold voltage compensation) may be provided to the gate terminal of the first transistor TR1.

The seventh transistor TR7 may include a gate terminal, a first terminal, and a second terminal. The gate terminal may receive the diode initialization signal GB. The first terminal may receive the initialization voltage VINT. The second terminal may be connected to the first terminal of the organic light emitting diode OLED. According to some embodiments, the first terminal of the seventh transistor TR7 may be a source terminal, and the second terminal of the seventh transistor TR7 may be a drain terminal. Alternatively, the first terminal of the seventh transistor TR7 may be a drain terminal, and the second terminal of the seventh transistor TR7 may be a source terminal.

The seventh transistor TR7 may provide the initialization voltage VINT to the first terminal of the organic light emitting diode OLED during an activation period of the diode initialization signal GB. In this case, the seventh transistor TR7 may operate in the linear region. That is, the seventh transistor TR7 may initialize the first terminal of the organic light emitting diode OLED to the initialization voltage VINT during the activation period of the diode initialization signal GB.

Alternatively, the gate initialization signal GI and the diode initialization signal GB may be signals substantially identical to each other. An operation of initializing the gate terminal of the first transistor TR1 and an operation of initializing the first terminal of the organic light emitting diode OLED may not affect each other. That is, the operation of initializing the gate terminal of the first transistor TR1 and the operation of initializing the first terminal of the organic light emitting diode OLED may be independent of each other.

The storage capacitor CST may include a first terminal and a second terminal. The storage capacitor CST may be connected between the wiring for the high power supply voltage ELVDD and the gate terminal of the first transistor TR1. For example, the first terminal of the storage capacitor CST may be connected to the gate terminal of the first transistor TR1, and the second terminal of the storage capacitor CST may be connected to the wiring for the high power supply voltage ELVDD. The storage capacitor CST may maintain a voltage level of the gate terminal of the first transistor TR1 during a deactivation period of the gate signal GW. The deactivation period of the gate signal GW may include the activation period of the light emission control signal EM, and the driving current ID generated by the first transistor TR1 may be provided to the organic light emitting diode OLED during the activation period of the light emission control signal EM. Therefore, the driving current ID generated by the first transistor TR1 may be provided to the organic light emitting diode OLED based on the voltage level maintained by the storage capacitor CST.

However, embodiments of the invention are note limited thereto. For example, a pixel circuit may have a configuration including at least one transistor and at least one storage capacitor.

Figure 4:
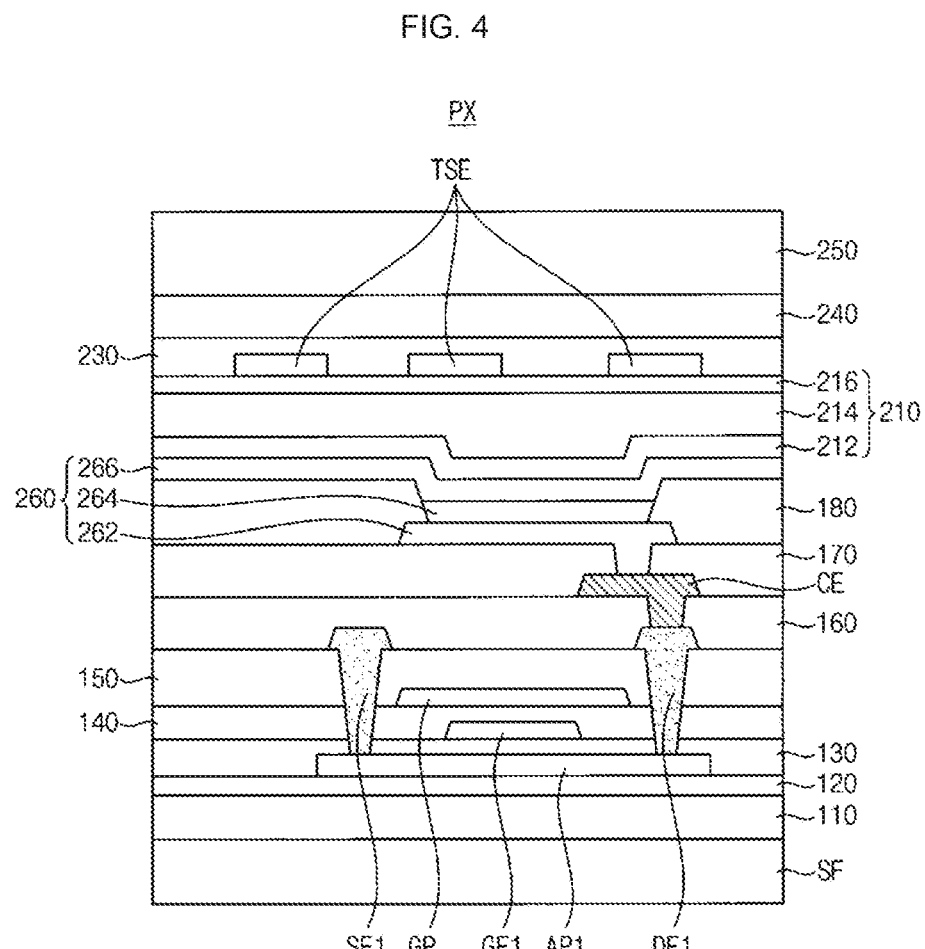
FIG. 4 is a cross-sectional view illustrating a pixel unit arranged in a display area of a display device according to some embodiments of the invention.

FIG. 4 is a cross-sectional view illustrating a pixel unit arranged in a display area of a display device according to some embodiments of the invention.

Referring to FIG. 4, a pixel unit PX arranged in a display area DA1 or DA2 may include a driving transistor arranged on a base substrate 110, an organic light-emitting diode 260 electrically connected to the driving transistor, and an encapsulation layer 210 covering the organic light-emitting diode 260. A supporting film SF may be arranged on a lower surface of the base substrate 110 to support the base substrate 110.

A buffer layer 120 may be arranged on the base substrate 110. A first active pattern AP1 may be arranged on the buffer layer 120.

For example, the base substrate 110 may include glass, quartz, silicon, a polymeric material or the like. For example, the polymeric material may include polyethylene terephthalate, polyethylene naphthalate, polyether ketone, polycarbonate, polyarylate, polyether sulfone, polyimide or the like.

The buffer layer 120 may prevent or reduce permeation of impurities, humidity or external gas from underneath of the base substrate 110, and may planarize an upper surface of the base substrate 110. For example, the buffer layer 120 may include an inorganic material such as oxide, nitride or the like.

A first gate electrode GE1 may be arranged on the first active pattern AP1. A first insulation layer 130 may be arranged between the first active pattern AP1 and the first gate electrode GE1.

A gate wiring pattern GP may be arranged on the first gate electrode GE1. The gate wiring pattern GP may include a capacitor electrode for forming a capacitor, a wiring for transferring various signals or the like.

A second insulation layer 140 may be arranged between the first gate electrode GE1 and the gate wiring pattern GP. A third insulation layer 150 may be arranged on the gate wiring pattern GP.

For example, the first active pattern AP1 may include silicon or a metal oxide semiconductor. According to some embodiments, the first active pattern AP1 may include polycrystalline silicon (polysilicon), which may be doped with n-type impurities or p-type impurities.

According to some embodiments, an active pattern may include a metal oxide semiconductor. For example, the active pattern may include a binary compound (ABx), a ternary compound (ABxCy) or a quarternary compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. For example, the first insulation layer 130, the second insulation layer 140 and the third insulation layer 150 may each have a single-layered structure or a multi-layered structure including silicon nitride and/or silicon oxide, or may have different structures from each other.

The first gate electrode GE1 and the gate wiring pattern GP may include a metal, a metal alloy, a metal nitride, a conductive metal oxide or the like. For example, the first gate electrode GE1 and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. According to some embodiments, the first gate electrode GE1 and the gate wiring pattern GP may have a multi-layered structure including at least molybdenum.

A first source metal pattern may be arranged on the third insulation layer 150. The first source metal pattern may include a source electrode SE and a drain electrode DE, which contact the first active pattern AP1. The source electrode SE and the drain electrode DE may each pass through the insulation layers arranged thereunder to contact the first active pattern AP1.

A fourth insulation layer 160 may be arranged on the first source metal pattern. A second source metal pattern may be arranged on the fourth insulation layer 160. The second source metal pattern may include a connection electrode CE to electrically connect the drain electrode DE to an organic light-emitting diode 260 arranged thereon. According to some embodiments, the second source metal pattern may further include a mesh power line to prevent voltage drop of a power applied to the organic light-emitting diode 260. A fifth insulation layer 170 may be arranged on the second source metal pattern.

The first and second source metal patterns may include a metal, a metal alloy, a metal nitride, a conductive metal oxide or the like. For example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. According to some embodiments, the first and second source metal patterns may have a multi-layered structure including at least aluminum. For example, the first and second source metal patterns may have a stacked structure of an aluminum layer and a titanium layer.

The fourth insulation layer 160 and the fifth insulation layer 170 may include an organic material. For example, the fourth insulation layer 160 and the fifth insulation layer 170 may include an organic insulation material such as a phenol resin, an acrylic resin, a polyimide resin, a polyamide resin, a siloxane resin, an epoxy resin or the like.

The organic light-emitting diode 260 may be arranged on the fifth insulation layer 170. The organic light-emitting diode 260 may include a first electrode 262 contacting the connection electrode CE, a light-emitting layer 264 arranged on the first electrode 262 and a second electrode 266 arranged on the light-emitting layer 264. The first electrode 262 may be a lower electrode of the organic light-emitting diode 260, and the second electrode 266 may be an upper electrode of the organic light-emitting diode 260.

The first electrode 262 may function as an anode. For example, the first electrode 262 may be formed as a light-transmitting electrode or a light-reflecting electrode according to an emission type of the display device. When the first electrode 262 is a light-transmitting electrode, the first electrode 262 may include indium tin oxide, indium zinc oxide, zinc tin oxide, indium oxide, zinc oxide, tin oxide or the like. When the first electrode 262 is a light-reflecting electrode, the first electrode 262 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the light-transmitting electrode.

The pixel-defining layer 180 has an opening exposing at least a portion of the first electrode 262. For example, the pixel-defining layer 180 may include an organic insulating material.

The light-emitting layer 264 may have a single-layered structure or a multi-layered structure including at least one of a hole injection layer, a hole transporting layer, an organic light-emitting layer, an electron transporting layer and an electron injection layer. For example, the light-emitting layer 264 may include a low molecular weight organic compound or a high molecular weight organic compound.

According to some embodiments, the light-emitting layer 264 may emit a red light, a green light or a blue light. According to some embodiments, the light-emitting layer 264 may emit a white light. The light-emitting layer 264 emitting a white light may have a multi-layered structure including a red-emitting layer, a green-emitting layer and a blue-emitting layer, or a single-layered structure including a mixture of a red-emitting material, a green-emitting material and a blue-emitting material.

The second electrode 266 may be formed as a light-transmitting electrode or a light-reflecting electrode according to an emission type of the display device. For example, the second electrode 266 may include a metal, a metal alloy, a metal nitride, a metal fluoride, a conductive metal oxide or a combination thereof.

For example, the second electrode 266 may extend continuously across a plurality of pixels in the display area. According to some embodiments, a capping layer and a blocking layer may be further formed on the second electrode 266.

The encapsulation layer 210 is arranged entirely in the display areas DA1 and DA2 to cover the organic light-emitting diode 260.

For example, the encapsulation layer 210 may have a stacked structure of an inorganic thin film and an organic thin film. For example, as illustrated in FIG. 4, the encapsulation layer 210 may include a first inorganic thin film 212, an organic thin film 214 arranged on the first inorganic thin film 212, and a second inorganic thin film 216 arranged on the organic thin film 214. However, embodiments of the invention are not limited thereto. For example, the encapsulation layer 210 may have a structure including at least two organic thin films and at least three inorganic thin films.

For example, the organic thin film 214 may include a cured polymer such as polyacrylate or the like. For example, the cured polymer may be formed from cross-linking reaction of monomers. For example, the inorganic thin films 212 and 216 may include an inorganic material such as silicon oxide, silicon nitride, silicon carbide, aluminum oxide, tantalum oxide, hafnium oxide, zirconium oxide, titanium oxide or the like.

A touch screen may be arranged on the encapsulation layer 210. For example, a touch-sensing electrode TSE and a touch insulation layer 230 covering the touch-sensing electrode TSE may be arranged on the encapsulation layer 210. For example, the touch-sensing electrode TSE may include a transparent conductive material such as indium tin oxide, indium zinc oxide or the like.

A polarization layer 240 and a protective window 250 may be arranged on the touch screen. An adhesive agent or a transparent adhesive film may be provided between the polarization layer 240 and the touch screen and between the polarization layer 240 and the protective window 250.

FIG. 4 illustrates a transistor transferring a power to an organic light-emitting diode, which is for ease of explanation. As explained in the above with reference to FIG. 3, a pixel unit may include a plurality of transistors, and the transistors may include difference channel materials, or may be formed in different layers.

Figure 5:
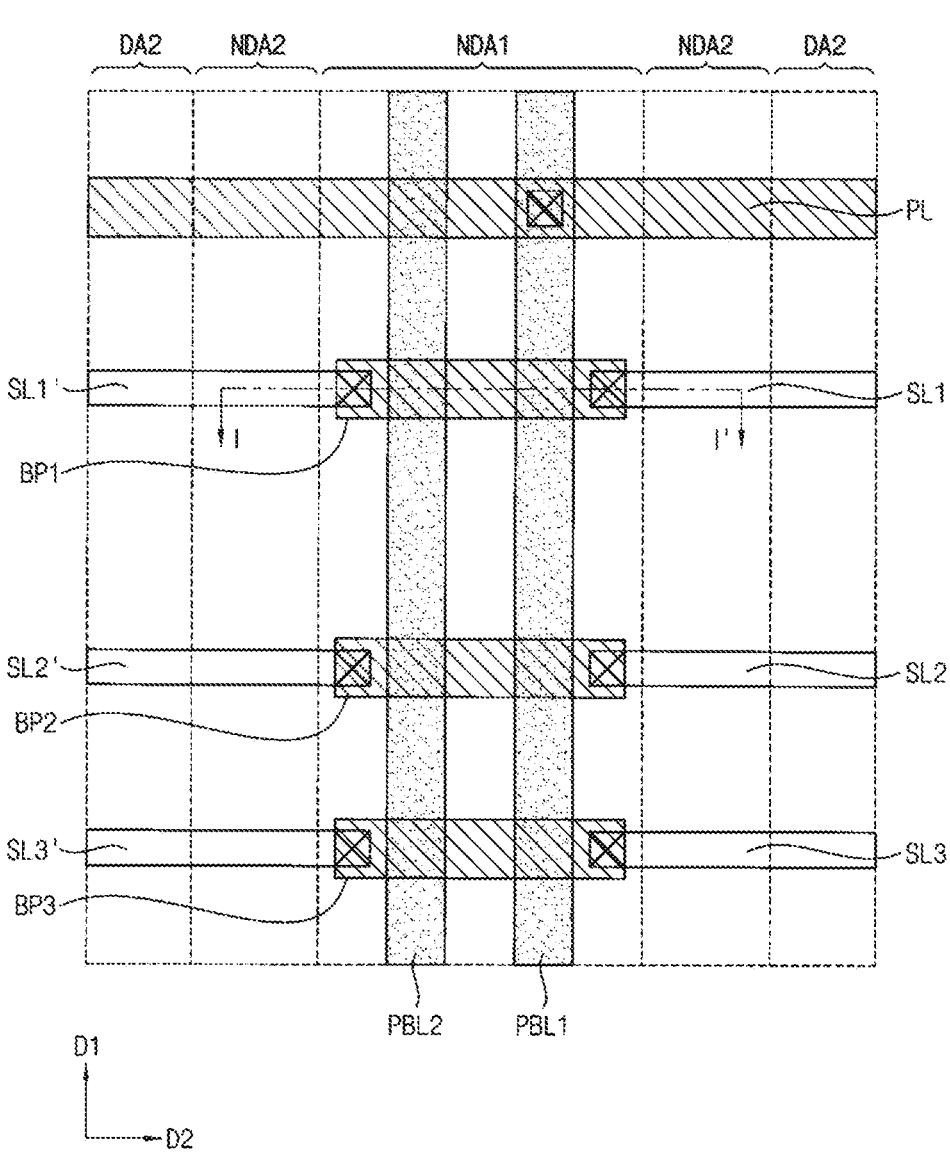
FIG. 5 is an enlarged plan view illustrating the region 'A' of FIG. 1
Figure 6:
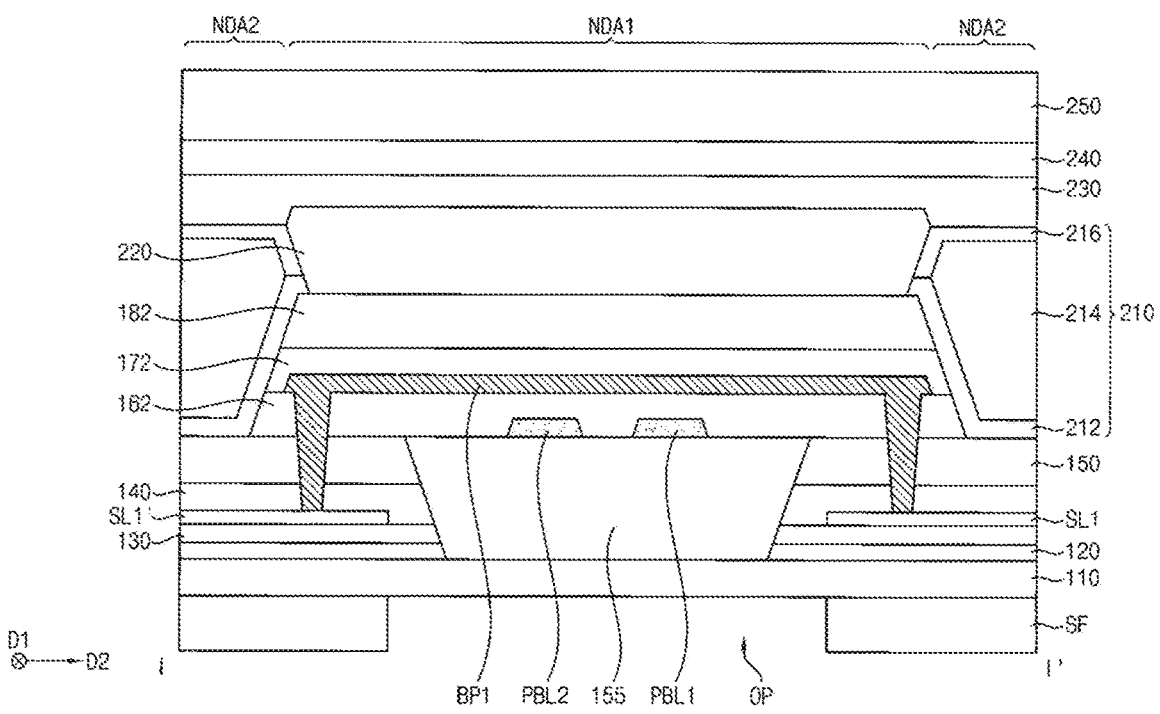
FIG. 6 is a cross-sectional view taken along the line I-I' of FIG. 5.

FIG. 5 is an enlarged plan view illustrating region 'A' of FIG. 1. FIG. 6 is a cross-sectional view taken along line I-I' of FIG. 5.

Referring to FIGS. 5 and 6, a non-display area includes a first non-display area NDA1 and a second non-display area NDA2. The second non-display area NDA2 is arranged between the first non-display area NDA1 and the display areas DA1 and DA2. For example, the first non-display area NDA1 may be defined by an area where the encapsulation layer 210 is not arranged. The second non-display area NDA2 may be defined by an area where an organic insulation layer is removed between the first non-display area NDA1 and the display areas DA1 and DA2. Thus, the encapsulation layer 210 may directly contact an inorganic insulation layer 140 under the encapsulation layer 210 in the second non-display area NDA2.

In the process of forming the encapsulation layer 120, monomers may be prevented from overflowing into the first non-display area NDA1 by the area where the organic insulation layer is removed.

According to some embodiments, the second non-display area NDA2 may be arranged in a flat area not having a curvature as the display areas DA1 and DA2 are. However, embodiments of the invention are not limited thereto. The second non-display area NDA2 may be arranged in a bending area having a curvature as the first non-display area NDA1 is.

According to some embodiments, the non-display area may extend along a first direction D1, and may be adjacent to the display areas DA1 and DA2 along a second direction D2 perpendicular to the first direction D1.

A signal wiring and a power wiring may be arranged in the display areas DA1 and DA2 and in the non-display area. According to some embodiments, the signal wiring may cross the non-display area and extend in the display areas DA1 and DA2 along the second direction D2.

The signal wiring may transfer various driving signals or driving voltages to pixels in the display areas DA1 and DA2. For example, the signal wiring may include a plurality of signal wirings respectively transferring different signals.

For example, a first signal wring may include a first signal wiring pattern SL1 that is arranged in the first display area DA1 and extends along the second direction D2, a second signal wiring pattern SL1' that is arranged in the second display area DA2 and extends along the second direction D2, and a first bridge pattern BP1 that electrically connects the first signal wiring pattern SL1 to the second signal wiring pattern SL1'.

A second signal wring may include a first signal wiring pattern SL2 that is arranged in the first display area DA1 and extends along the second direction D2, a second signal wiring pattern SL2' that is arranged in the second display area DA2 and extends along the second direction D2, and a second bridge pattern BP2 that electrically connects the first signal wiring pattern SL2 to the second signal wiring pattern SL2'.

A third signal wring may include a first signal wiring pattern SL3 that is arranged in the first display area DA1 and extends along the second direction D2, a second signal wiring pattern SL3' that is arranged in the second display area DA2 and extends along the second direction D2, and a third bridge pattern BP3 that electrically connects the first signal wiring pattern SL3 to the second signal wiring pattern SL3'.

The first to third signal wirings may transfer the initialization voltage VINT, the gate signal GW, the gate initialization signal GI, the light emission control signal EM, the diode initialization signal GB or the like, which are illustrated in FIG. 3. For example, the first signal wiring may transfer the gate signal GW, the second signal wiring may transfer the light emission control signal EM, the third signal wiring may transfer the initialization voltage VINT. However, the above combination is an example embodiment. Embodiments of the invention are not limited thereto, and various combinations may be possible.

According to some embodiments, the display device includes a power bus wiring extending along the first direction D1 in the non-display area, and a power wiring PL extending along the second direction D2 in the display areas DA1 and DA2 and in the non-display area.

According to some embodiments, the power bus wiring includes a first power bus wiring PBL1 and a second power bus wiring PBL2. The first power bus wiring PBL1 is electrically connected to the power wiring OL to provide a first power voltage to the power wiring PL. The first power voltage may be provided to a driving transistor. The second power bus wiring PBL may transfer a second power voltage provided to a cathode of an organic light-emitting diode.

The power bus wiring and the power wiring PL may be arranged in different layers from each other. For example, the power bus wiring may be included in the first source metal pattern, and the power wiring PL may be included in the second source metal pattern.

According to some embodiments, the encapsulation layer 210 and an inorganic layer are removed in the first non-display area NDA1 corresponding to the bending area. Furthermore, as the inorganic layer is removed, a gate metal pattern having a small ductility is removed. Furthermore, because the non-display area does not generate a light, a light-emitting element is not arranged in the non-display area. Thus, as the inorganic layer, a common layer for the light-emitting element and the gate metal pattern, which are weak at a bending stress, are removed, an effect substantially reducing a curvature of the bending area of the display device may be achieved.

Referring to FIG. 6, a buffer layer 120, a first insulation layer 130, a second insulation layer 140 and a third insulation layer 150, which extend from a display area and includes an inorganic material, are removed in at least a portion of the first non-display area NDA1. An area where the inorganic layers are removed may extend along the first direction D1 as the first non-display area NDA1.

A lower compensation layer 155 may be arranged in the area where the inorganic layers are removed. The lower compensation layer 155 may compensate for height difference and may reduce stress caused by bending. The lower compensation layer 155 may contact an upper surface of the base substrate 110. For example, the lower compensation layer 155 may include an organic insulation material similar to a material for the fourth insulation layer 160 or the like.

According to some embodiments, the lower compensation layer 155 may have a pattern shape filling the area where the inorganic layers are removed. However, embodiments of the invention are not limited thereto. The lower compensation layer 155 may extend continuously in a horizontal direction to cover an upper surface of the third insulation layer 150.

The power bus wirings PBL1 and PBL2 may be arranged on the lower compensation layer 155. The power bus wirings PBL1 and PBL2 may be included in the first source metal pattern to be arranged in a same layer as the first source electrode SE1 and the first drain electrode DE1 in the display area.

The first signal wiring pattern SL1 and the second signal wiring pattern SL1' of the first signal wiring may be formed from a same layer as the first gate electrode GE1. Thus, the first signal wiring pattern SL1 and the second signal wiring pattern SL1' of the first signal wiring may be arranged between the first insulation layer 130 and the second insulation layer 140. However, embodiments of the invention are not limited thereto. For example, the first signal wiring pattern SL1 and the second signal wiring pattern SL1' of the first signal wiring may be formed from a same layer as the gate wiring pattern GP.

An organic protective pattern is arranged in the first non-display area NDA1. The organic protective pattern may protect a signal wiring, a power wiring, a power bus wiring or the like. Furthermore, the organic protective pattern may function as a dam that prevents monomers from overflowing into the first non-display area NDA1 when the organic thin film 214 of the encapsulation layer is formed. The organic protective pattern may extend along the first direction D1 as the first non-display area NDA1.

For example, the organic protective pattern may include a first organic pattern 162, a second organic pattern 172 arranged on the first organic pattern 162 and a third organic pattern 182 arranged on the second organic pattern 172. The first organic pattern 162 may be formed from a same layer as the fourth insulation layer 160 in the display area, the second organic pattern 172 may be formed from a same layer as the fifth insulation layer 170 in the display area, and the third organic pattern 182 may be formed from a same layer as the pixel-defining layer 180 in the display area. However, embodiments of the invention are not limited to the above combination. For example, the organic protective pattern may have a double-layered structure or a multi-layered structure including at least four layers.

Referring to FIG. 6, the first organic pattern 162 is arranged on the third insulation layer 150 and the lower compensation layer 155 and covers the power bus wirings PBL1 and PBL2.

A first bridge pattern BP1 is arranged on the first organic pattern BP1. The first bridge pattern BP1 may be included in the second source metal pattern to be arranged in a same layer as the connection electrode CE in the display area. The first bridge pattern BP1 may pass through the first organic pattern 162 and inorganic layers thereunder to form an electric contact with the first signal wiring pattern SL1 and the second signal wiring pattern SL1' of the first signal wiring. The first signal wiring may cross the non-display area to extend from the first display area DA1 to the second display area DA2.

An upper compensation layer 220 may be arranged on the organic protective pattern. As the encapsulation layer 210 is removed in the first non-display area NDA1, a height difference may be generated. The upper compensation layer 220 may compensate for the height difference and may reduce stress caused by bending. Thus, the upper compensation layer 220 may fill a gap between a first encapsulation layer arranged in the first display area DA1 and a second encapsulation layer arranged in the second display area DA2.

For example, the upper compensation layer 220 may be formed by coating or selectively dropping an organic material such as a binder resin, a curable monomer or the like. For example, the upper compensation layer 220 may include a phenol resin, an acrylic resin, a siloxane resin, an epoxy resin or the like.

A touch insulation layer 230, a polarization layer 240 and a protective window 250 may be arranged on the upper compensation layer 220.

According to some embodiments, a supporting film SF attached to a lower surface of the base substrate 110 may have an opening OP overlapping the first non-display area NDA1. The opening OP may be defined by an area where the supporting film SF is removed. Accordingly, stress caused by the supporting film SF may be reduced.

Furthermore, because the bridge pattern, the power bus wiring, the power wiring or the like, which is arranged in the non-display area, is formed from a source metal pattern including aluminum, which has a relatively high ductility, reliability of wirings may be increased.

FIGS. 7 to 10 are cross-sectional views illustrating a display device according to some embodiments of the invention.

Figure 7:
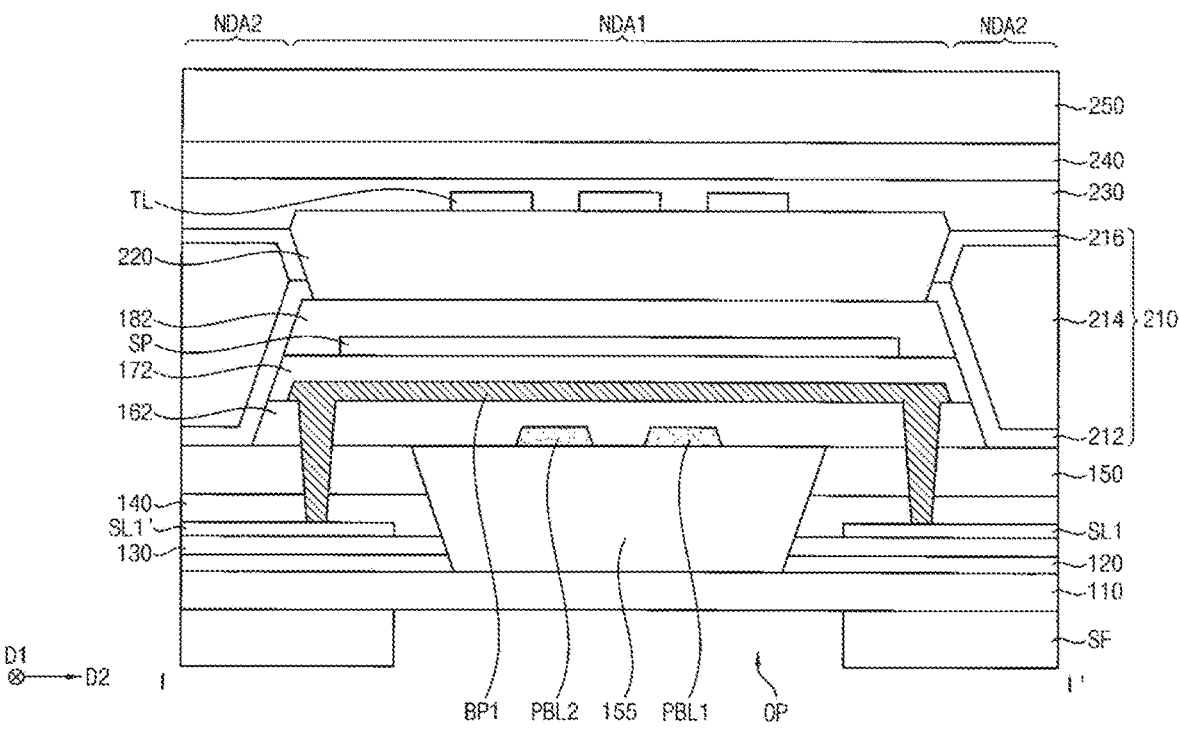
FIGS. 7 to 10 are cross-sectional views illustrating a display device according to some embodiments of the invention.

Referring to FIG. 7, a touch-sensing line TL and a shielding pattern SP may be further arranged in a first non-display area NDA1 of a display device.

According to some embodiments, the touch-sensing line TL may be arranged on an upper compensation layer 220, and may extend along a first direction D1 in the first non-display area NDA1. The touch-sensing line TL may be electrically connected to a touch-sensing electrode TSE in a display area to provide a voltage required for sensing and to transfer a capacitance variance. For example, the touch-sensing line TL may be formed from a same layer as the touch-sensing electrode TSE.

The shielding pattern SP may be arranged between the touch-sensing line TL and the signal wiring to prevent a sensing noise caused by interference of the signal wiring.

According to some embodiments, the shielding pattern SP may be arranged between a second organic pattern 172 and a third organic pattern 182. For example, the shielding pattern SP may be formed from a same layer as a first electrode 262 of an organic light-emitting diode 260.

The touch-sensing line TL and the shielding pattern SP may extend along the first direction D1 as the first non-display area NDA1 does.

Figure 8:
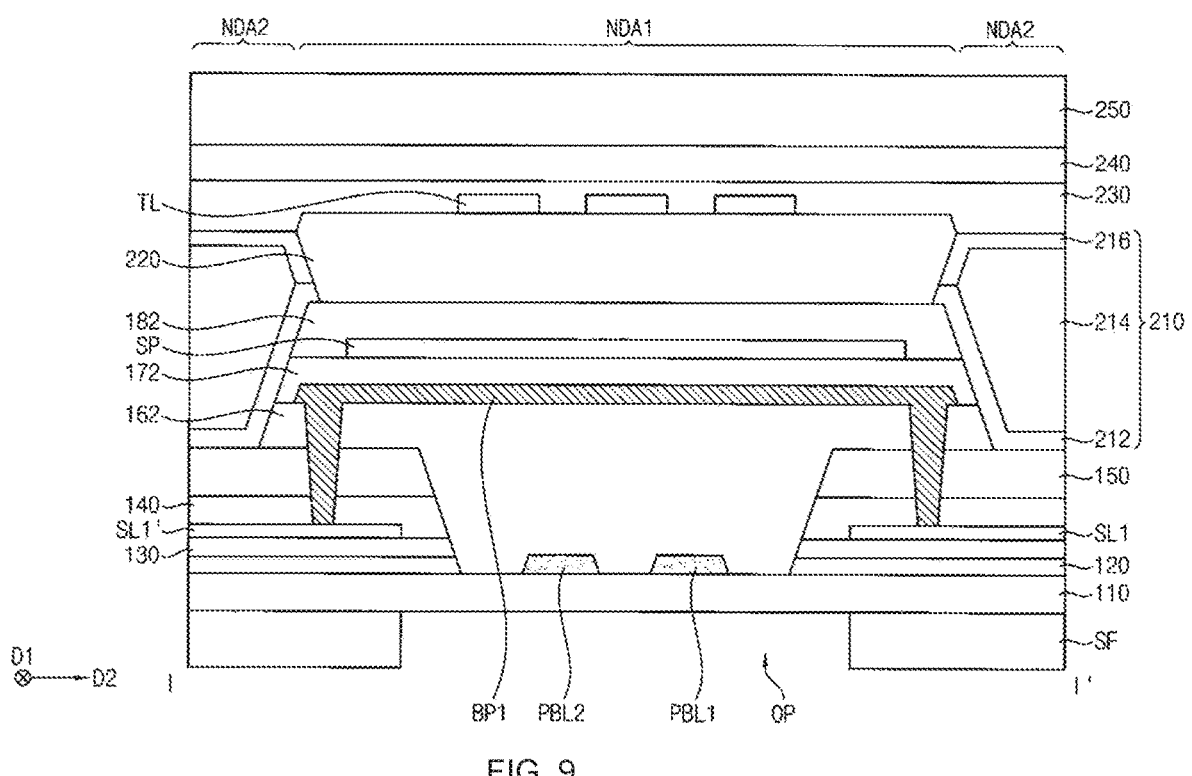

Referring to FIG. 8, power bus wirings PBL1 and PBL2 may be arranged directly on an upper surface of the base substrate 110 in an area where a buffer layer 120, a first insulation layer 130, a second insulation layer 140 and a third insulation layer 150, which include an inorganic material.

A first organic pattern 162 of an organic protective pattern may fill the area where the inorganic layers are removed, and may cover the power bus wirings PBL1 and PBL2.

According to the above configuration, the lower compensation layer 155 illustrated in FIG. 6 may be omitted, and the first organic pattern 162 may form a filling part. Thus, processes for manufacturing a display device may be simplified.

Figure 9:
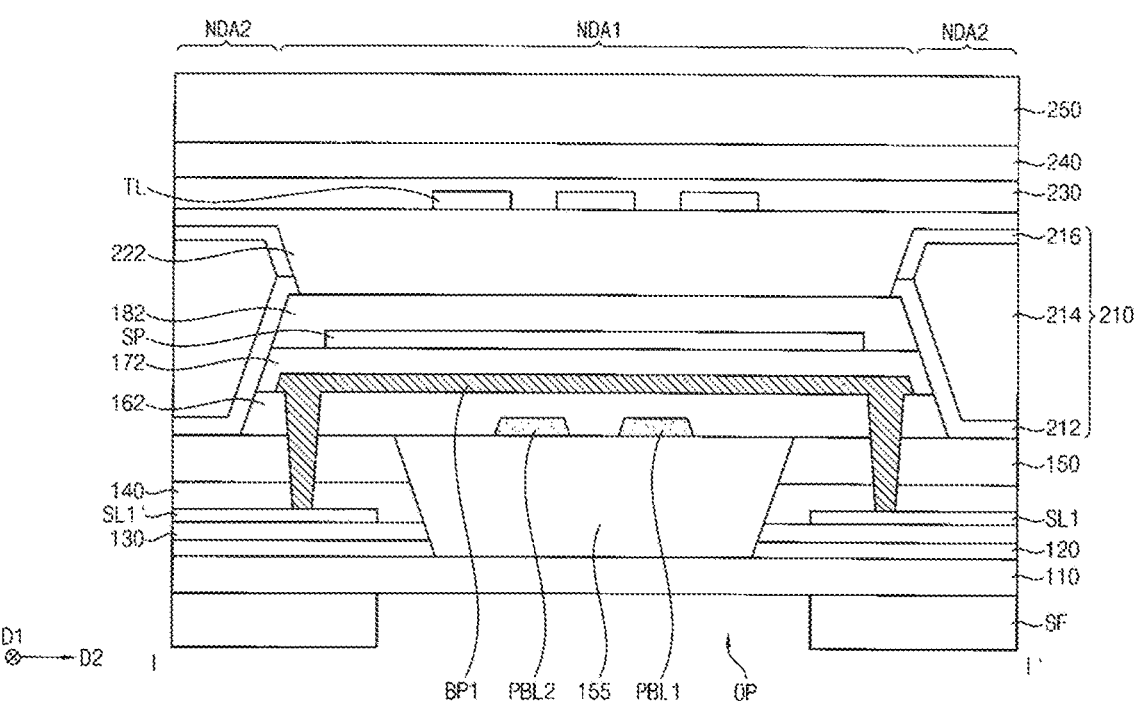

Referring to FIG. 9, an upper compensation layer 222 arranged on an organic protective pattern may extend in a horizontal direction to cover an upper surface of an encapsulation layer 210.

Figure 10:
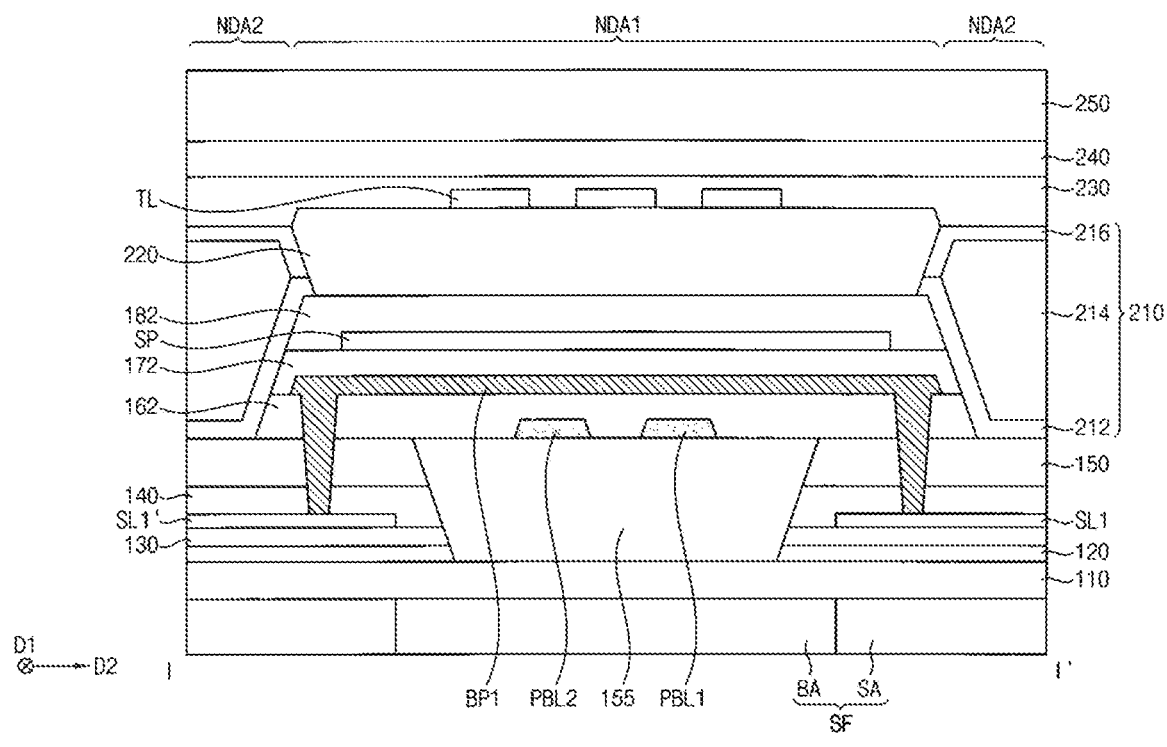

Referring to FIG. 10, a supporting film SF attached to a lower surface of a base substrate 110 may include a supporting portion SA, which overlaps a display area, and a bending portion BA, which overlaps a first non-display area NDA1. According to some embodiments, the bending portion BA includes a material different from the supporting portion SA. The bending portion BA may include a material having a greater flexibility or a greater ductility than the supporting portion SA. For example, the supporting portion SA may include polyimide, polycarbonate, polyethylene terephthalate, polymethyl methacrylate or the like, and the bending portion BA may include polyurethane or the like.

Accordingly, stress in a bending area may be reduced.

Figure 11:
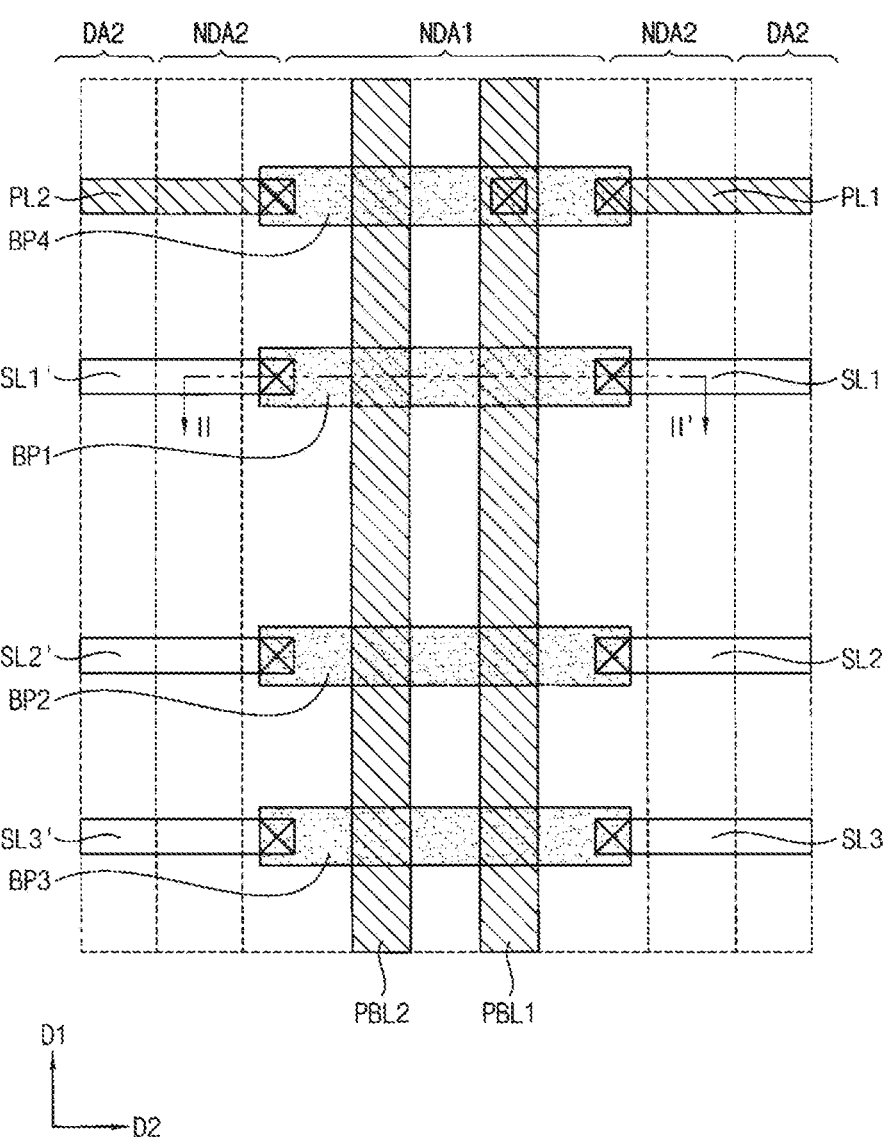
FIG. 11 is an enlarged plan view illustrating a bending area of a display device according to some embodiments of the invention.
Figure 12:
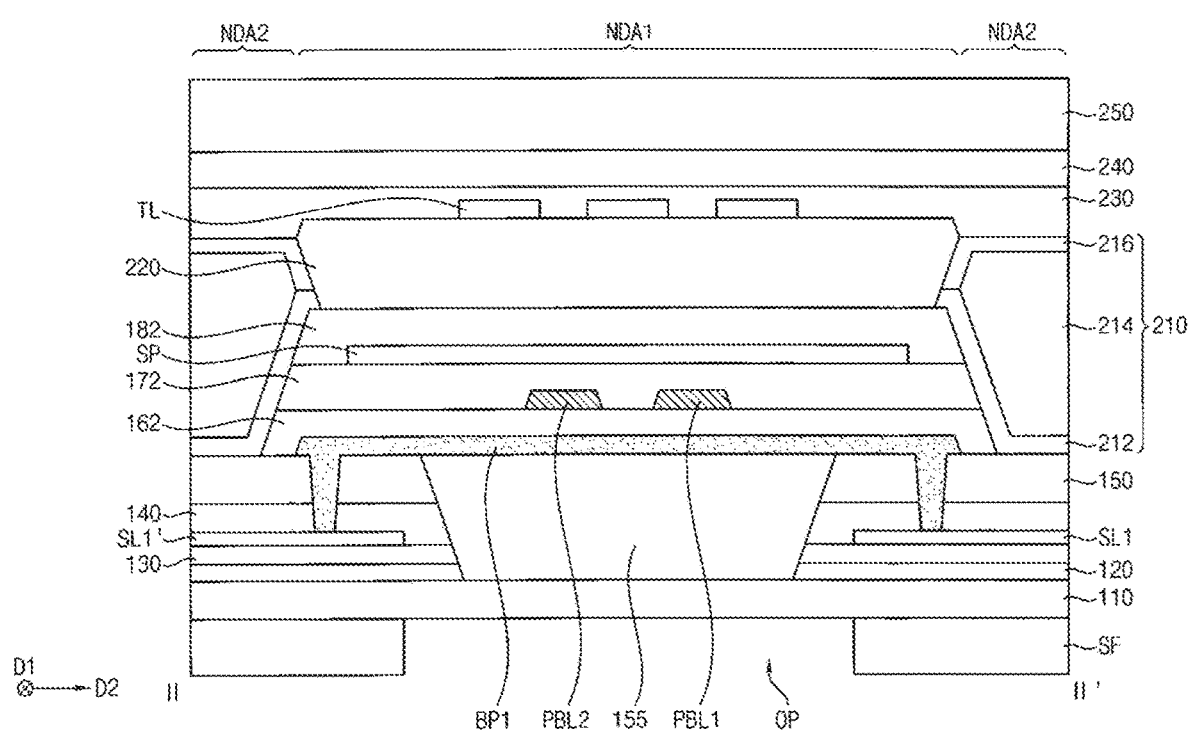
FIG. 12 is a cross-sectional view taken along the line II-II' of FIG. 11.

FIG. 11 is an enlarged plan view illustrating a bending area of a display device according to some embodiments of the invention. FIG. 12 is a cross-sectional view taken along the line II-II' of FIG. 11.

Referring to FIGS. 11 and 12, bridge patterns BP1, BP2 and BP3 for continuing a signal wiring may be arranged in a first non-display area NDA1. Furthermore, power bus wirings PBL1 and PBL2 extending along a first direction D1 may be arranged in the first non-display area NDA1.

According to some embodiments, a power wiring arranged in a display area and the power bus wirings PBL1 and PBL2 arranged in the first non-display area NDA1 may be arranged in a same layer. Thus, a bridge pattern BP4 may be arranged in the first non-display area NDA1 to connect a first and second power bus wiring patterns PL1 and PL2, which are separated from each other by the first non-display area NDA1, to each other.

According to some embodiments, the bridge patterns BP1, BP2, BP3 and BP4 may be arranged under the power bus wirings PBL1 and PBL2. For example, the bridge patterns BP1, BP2, BP3 and BP4 may be included in a first source metal pattern to be arranged in a same layer as a first source electrode SE1 and a first drain electrode DE1 in the display area. The power bus wirings PBL1 and PBL2 may be included in a second source metal pattern to be arranged in a same layer as a connection electrode CE in the display area.

For example, the bridge patterns BP1, BP2, BP3 and BP4 may be arranged between an organic protective pattern and a base substrate 110. A lower compensation layer 155 may be arranged under the bridge patterns BP1, BP2, BP3 and BP4.

For example, the power bus wirings PBL1 and PBL2 may be arranged between a first organic pattern 162 and a second organic pattern 172 of the organic protective pattern.

Figure 13:
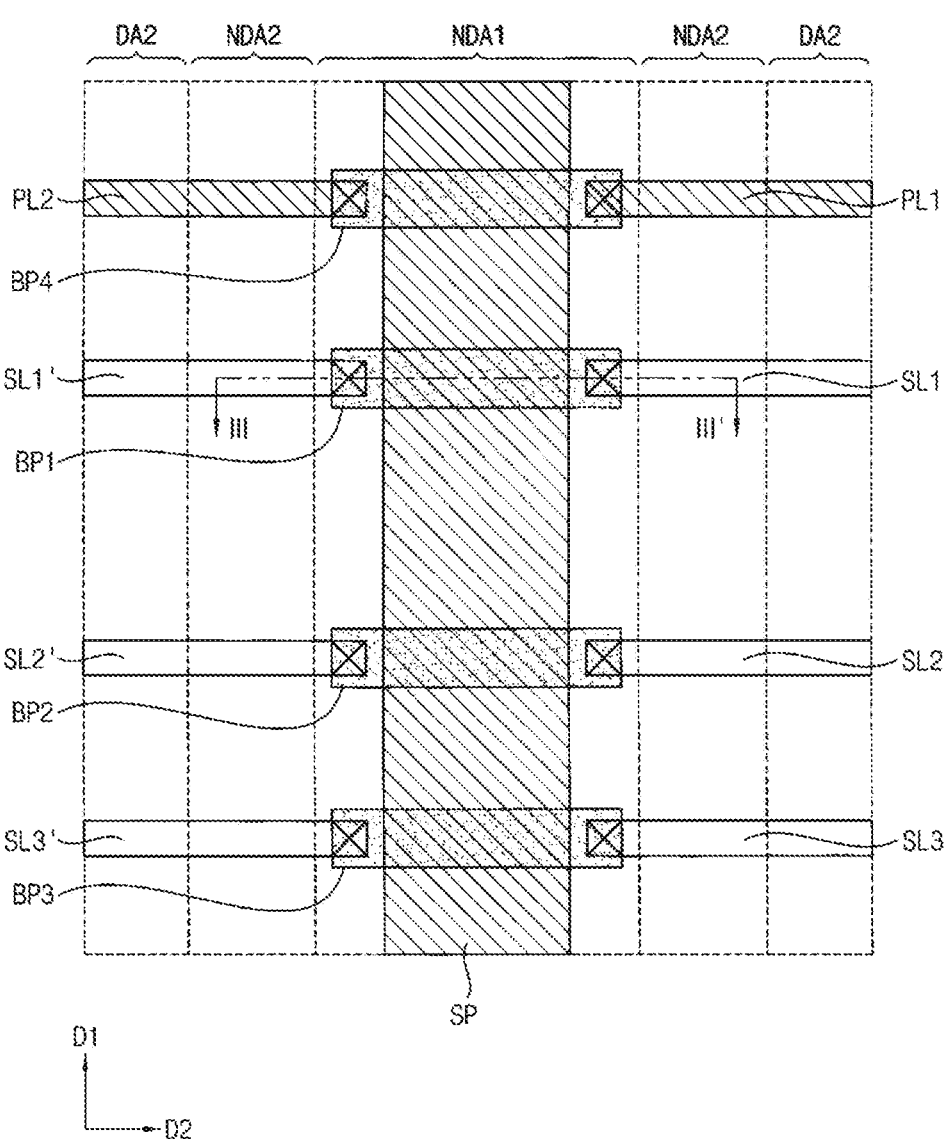
FIG. 13 is an enlarged plan view illustrating a bending area of a display device according to some embodiments of the invention.
Figure 14:
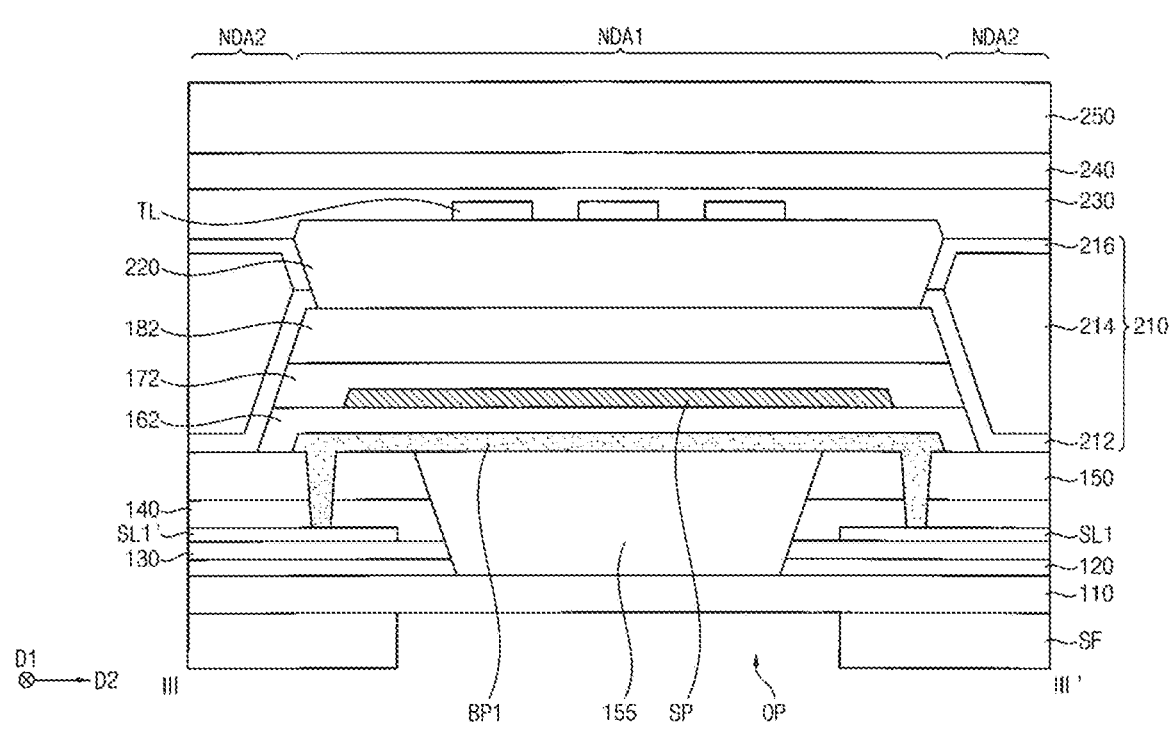
FIG. 14 is a cross-sectional view taken along the line III-III' of FIG. 13.

FIG. 13 is an enlarged plan view illustrating a bending area of a display device according to some embodiments of the invention. FIG. 14 is a cross-sectional view taken along the line III-III' of FIG. 13.

Referring to FIGS. 13 and 14, bridge patterns BP1, BP2 and BP3 for continuing a signal wiring may be arranged in a first non-display area NDA1. Furthermore, a bridge pattern BP4 may be arranged in the first non-display area NDA1 to connect power bus wiring patterns PL1 and PL2, which are separated from each other by the non-display area, to each other.

A touch-sensing line TL and a shielding pattern SP, which extend along a first direction D1, are arranged in the first non-display area NDA1.

The shielding pattern SP may be arranged between the touch-sensing line TL and a signal wiring to prevent a sensing noise caused by interference of the signal wiring.

According to some embodiments, the bridge patterns BP1, BP2, BP3 and BP4 may be included in a first source metal pattern to be arranged in a same layer as a first source electrode SE1 and a first drain electrode DE1 in the display area. The shielding pattern SP may be included in a second source metal pattern to be arranged in a same layer as a connection electrode CE in the display area. Thus, the shielding pattern SP may be arranged between a second organic pattern 172 and a first organic pattern 162.

Figure 15:
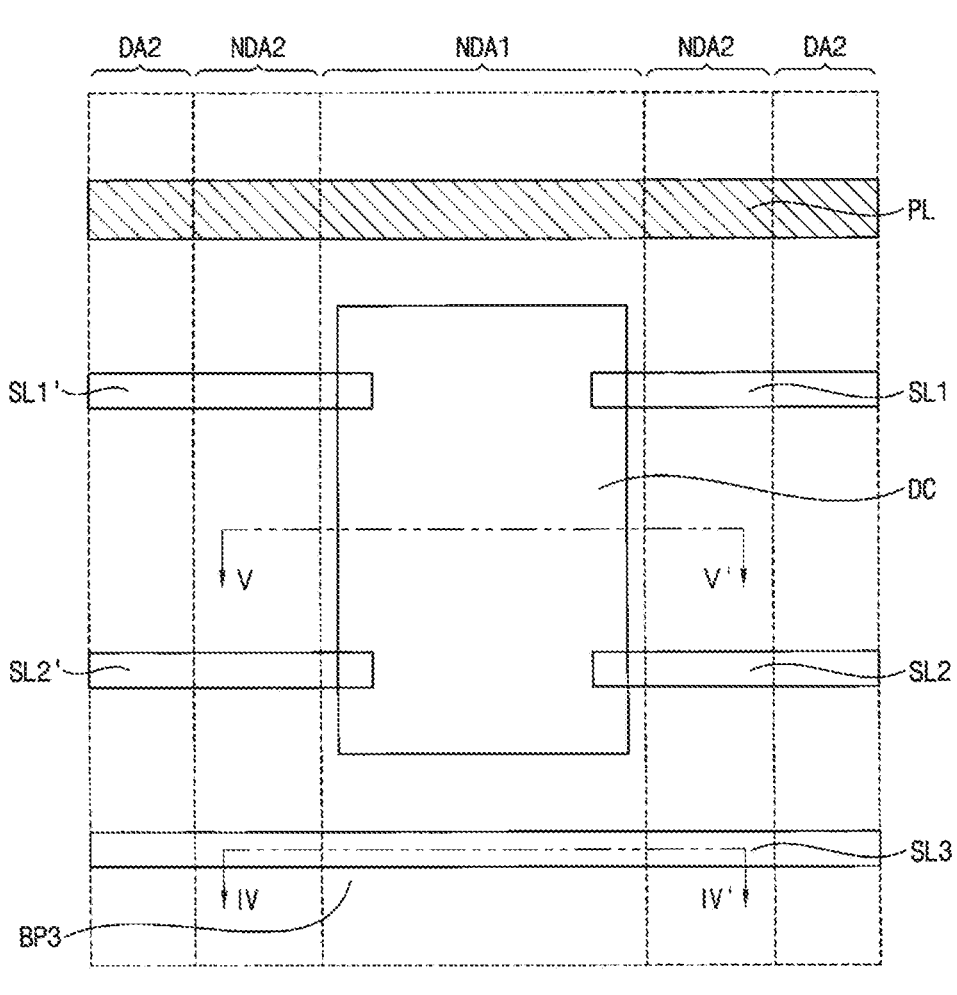
FIG. 15 is an enlarged plan view illustrating a bending area of a display device according to some embodiments of the invention.
Figure 15:
Figure 16:
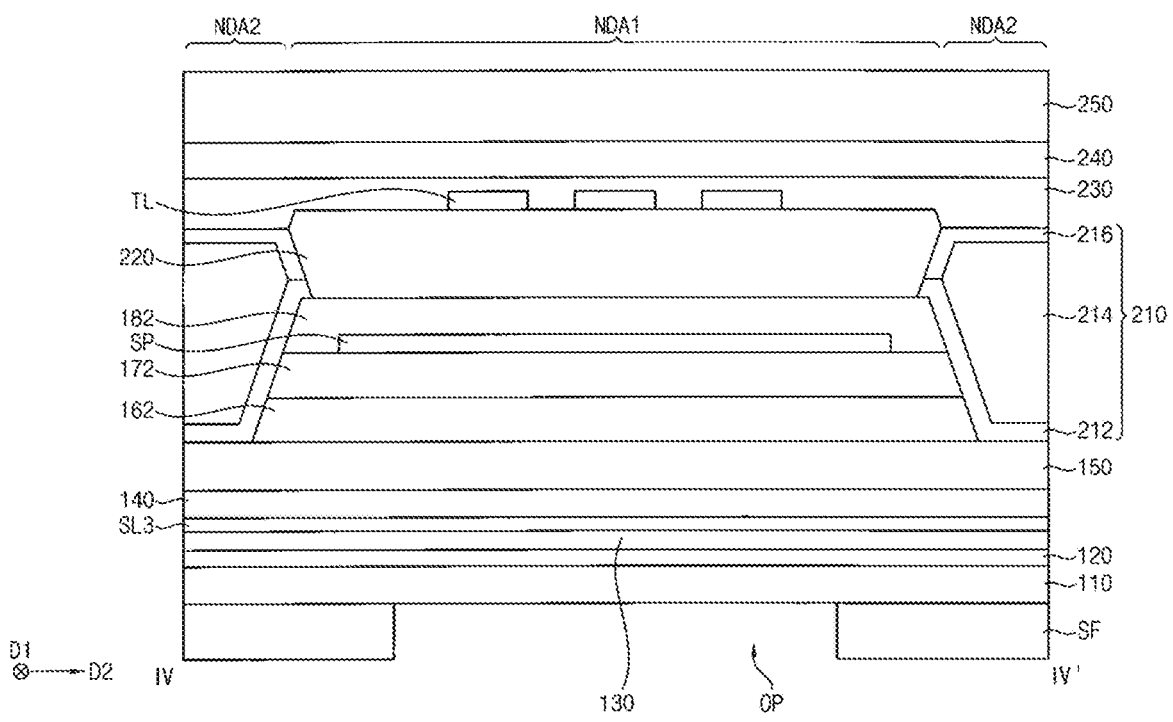
FIG. 16 is a cross-sectional view taken along the line IV-IV' of FIG. 15.

FIG. 15 is an enlarged plan view illustrating a bending area of a display device according to some embodiments of the invention. FIG. 16 is a cross-sectional view taken along the line IV-IV' of FIG. 15.

Referring to FIGS. 15 and 16, a driving circuit DC is arranged in a first non-display area NDA. The driving circuit DC may generate a driving signal. For example, the driving signal may include a gate signal, a light emission control signal or the like. For example, the driving circuit DC may provide a gate signal to a first signal wiring SL1 and SL1' and may provide a light emission control signal to a second signal wiring SL2 and SL2'.

Figure 17:
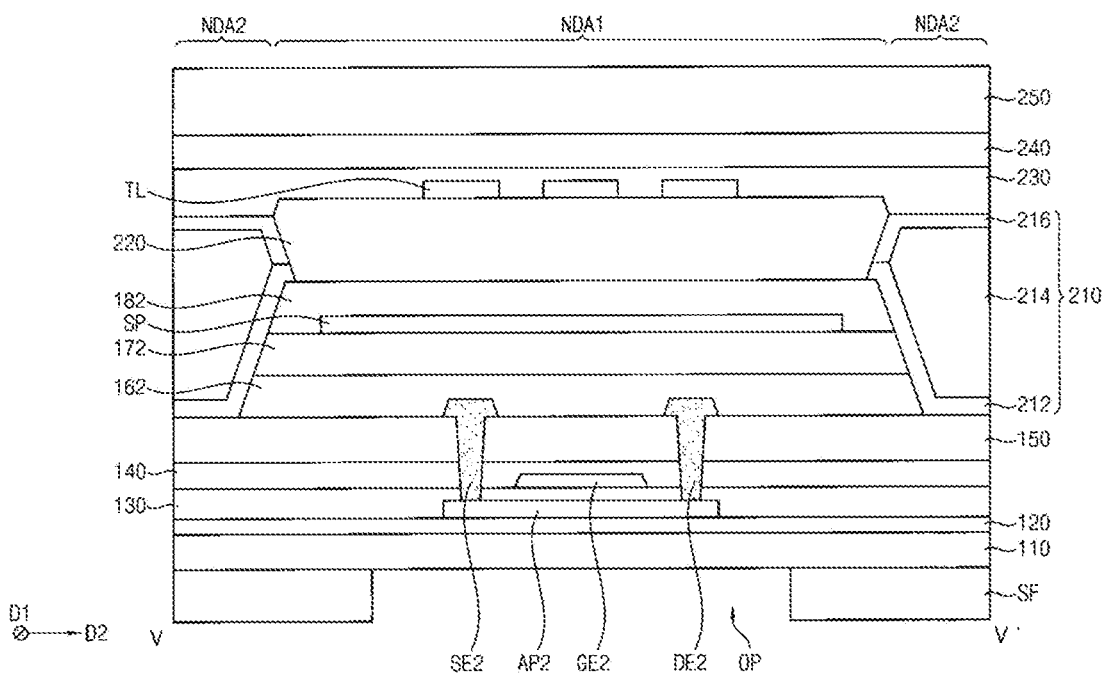
FIG. 17 is a cross-sectional view taken along the line V-V' of FIG. 15.

The driving circuit DC may include a transistor to generate a driving signal. The transistor of the driving circuit DC may be formed with a transistor in a display area. For example, as illustrated in FIG. 17, the transistor of the driving circuit DC may include a second active pattern AP2 arranged on a buffer layer 120, a second gate electrode GE2 arranged on a first insulation layer 130 and overlapping the second active pattern AP2, a second source electrode SE2 and a second drain electrode DE2, which contact the second active pattern AP2.

An organic protective pattern and an upper compensation layer 220 may be arranged on the transistor of the driving circuit DC. Furthermore, a touch-sensing line TL may be arranged on the upper compensation layer 220, and a shielding pattern SP may be arranged under the touch-sensing line TL.

According to some embodiments, inorganic layers 120, 130, 140 and 150 are not removed but remain in a first non-display area NDA1 for forming the driving circuit DC in the first non-display area NDA1. Thus, as illustrated in FIG. 16, a wiring SL3 not receiving a driving signal from the driving circuit DC may pass through the first non-display area NDA1 without a bridge pattern.

According to some embodiments, the driving circuit DC generating a driving signal may be arranged in the non-display area of a bending area. Thus, a size of a peripheral area may be reduced. Furthermore, because an encapsulation layer is removed in the non-display area and a compensation layer is arranged in the non-display area, stress in the bending area may be reduced.

Figure 18:
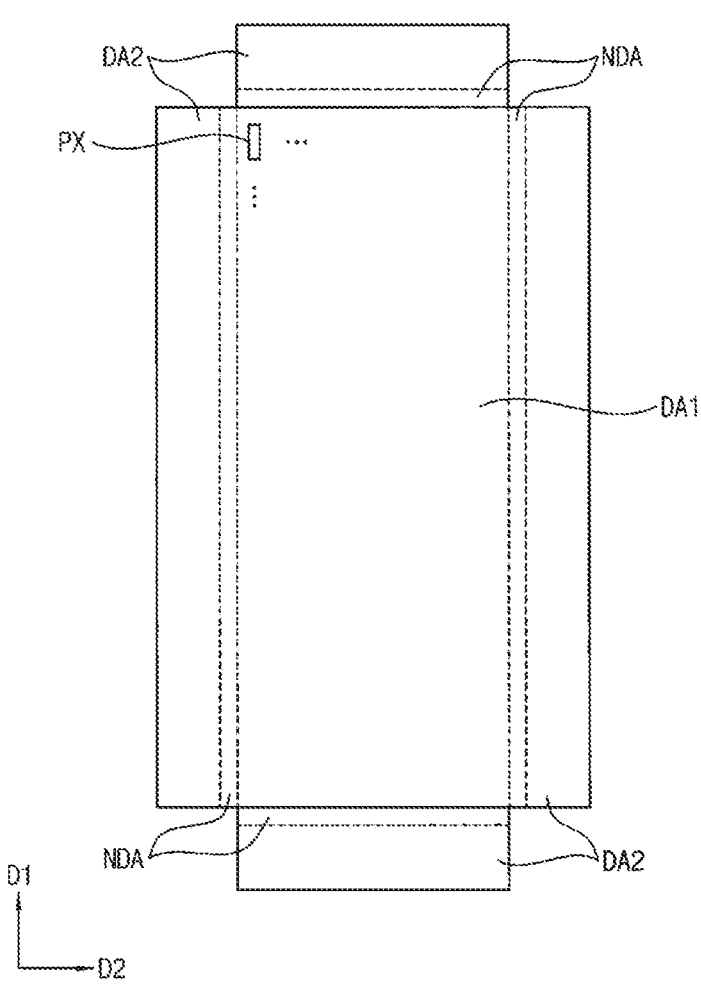
FIG. 18 is a plan view illustrating a display device according to some embodiments of the invention.

FIG. 18 is a plan view illustrating a display device according to some embodiments of the invention.

Referring to FIG. 18, a display device 20 according to some embodiments of the invention includes a first display area DA1 and a second display area DA2. According to some embodiments, the display device 20 may partially bend to have a lateral display area. For example, the first display area DA1 may correspond to a front display area, and the second display area DA2 may correspond to a lateral display area.

An array of pixels PX including a light-emitting element are arranged in each of the display areas DA1 and DA2 to generate a light in response to a driving signal.

According to some embodiments, the display device 20 includes a non-display area NDA arranged between the first display area DA1 and the second display area DA2. According to some embodiments, at least a portion of the non-display area NDA may bend to have a curvature. Thus, the non-display area NDA may correspond to a bending area connecting the front display area and the lateral display area.

According to some embodiments, the display device 20 may include four of second display areas DA2, which respectively correspond to each side of the first display area DA1 having a rectangular shape. Thus, the display device 20 may include four of non-display areas NDA.

Thus, the display device 20 may display an image at a front surface and at four side surfaces.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

ABILITY OF INDUSTRIAL UTILITY

The invention may be applied to various display devices. For example, the invention may be applied to vehicle-display device, a ship-display device, an aircraft-display device, portable communication devices, display devices for display or for information transfer, a medical-display device, etc.

The invention claimed is:

1. A display device including a first display area, a second display area and a non-display area between the first display area and the second display area and extending in a first direction, the first display area extending in a horizontal direction, the second display area extending in a vertical direction, the first display area and the second display area including an array of pixels, each of the pixels including at least one transistor, at least a portion of the non-display area having a bending area connecting the first display area to the second display area, the display device comprising:

light-emitting elements on a base substrate in the first display area and in the second display area;

a first encapsulation layer covering light-emitting elements in the first display area;

a second encapsulation layer covering light-emitting elements in the second display area and spaced apart from the first encapsulation layer;

a signal wiring crossing the non-display area and extending in a second direction;

a power bus wiring configured to transfer a power voltage and disposed in the non-display area between the first display area and the second display area and extending in the first direction to cross the signal wiring, wherein the signal wiring transfers a gate signal to the transistor of the pixels; and an upper compensation layer in the non-display area and filling a gap between the first encapsulation layer and the second encapsulation layer, wherein a portion of the signal wiring, which overlaps the power bus wiring, is disposed above the power bus wiring and transfers the gate signal.

2. The display device of claim 1, further comprising an organic protective pattern under the upper compensation layer.

3. The display device of claim 2, wherein the non-display area includes:

a first non-display area at the organic protective pattern; and a second non-display area where the first and second encapsulation layers, which extend from the first and second display areas, directly contact an inorganic insulation layer thereunder.

4. The display device of claim 3, wherein the signal wiring includes: a first signal wiring pattern under the inorganic insulation layer;

a second signal wiring pattern spaced apart from the first signal wiring pattern in the second direction; and a bridge pattern in the first non-display area and electrically contacting the first signal wiring pattern and the second signal wiring pattern.

5. The display device of claim 4, wherein the organic protective pattern includes a first organic pattern and a second organic pattern on the first organic pattern, wherein the bridge pattern is between the first organic pattern and the second organic pattern.

6. The display device of claim 2, further comprising a lower compensation layer between the base substrate and the organic protective pattern and including an organic material.

7. The display device of claim 6, wherein the signal wiring extends over the lower compensation layer.

8. The display device of claim 2, wherein the power bus wiring is under the organic protective pattern.

9. The display device of claim 1, further comprising a power wiring crossing the non-display area and extending in the second direction.

10. The display device of claim 9, wherein the power wiring includes: a first power wiring pattern extending in the second direction;

a second power wiring pattern spaced apart from the first power wiring pattern; and a bridge pattern in the non-display area and electrically contacting the first power wiring pattern and the second power wiring pattern.

11. The display device of claim 1, further comprising a supporting film combined with a lower surface of the base substrate and having an opening overlapping the non-display area.

12. The display device of claim 1, further comprising a supporting film combined with a lower surface of the base substrate, wherein the supporting film includes a supporting portion overlapping the first and second display areas and a bending portion overlapping the non-display area and including a material different from the supporting portion.

13. The display device of claim 1, further comprising a driving circuit in the non-display area.

14. A display device including a first display area, a second display area and a non-display area between the first display area and the second display area and extending in a first direction, the first display area extending in a horizontal direction, the second display area extending in a vertical direction, at least a portion of the non-display area having a bending area connecting the first display area to the second display area, the display device comprising:

light-emitting elements on a base substrate in the first display area and in the second display area;

a first encapsulation layer covering light-emitting elements in the first display area;

a second encapsulation layer covering light-emitting elements in the second display area;

a signal wiring crossing the non-display area and extending in a second direction;

an upper compensation layer in the non-display area and filling a gap between the first encapsulation layer and the second encapsulation layer;

a touch-sensing line extending along the first direction in the non-display area and on the upper compensation layer; and a shielding pattern between the upper compensation layer and the signal wiring.

15. The display device of claim 14, wherein the shielding pattern is in a same layer as a lower electrode of a light-emitting element from among the light-emitting elements.

16. The display device of claim 14, further comprising a power bus wiring under the shielding pattern and extending in the first direction.

* * * * *